United States Patent
Nam et al.

(10) Patent No.: US 10,194,567 B2
(45) Date of Patent: Jan. 29, 2019

(54) METHOD FOR MANUFACTURING SHIELD CANS FOR BLOCKING ELECTROMAGNETIC WAVES

(71) Applicant: 369 TECH CO., LTD., Ansan-si, Gyeonggi-Do (KR)

(72) Inventors: Kyung Sik Nam, Suwon-si (KR); Keun Hun Ahn, Hwaseong-si (KR)

(73) Assignee: 369 TECH CO., LTD., Ansan-si (KR)

(*) Notice: Subject to any disclaimer, the term of this patent is extended or adjusted under 35 U.S.C. 154(b) by 324 days.

(21) Appl. No.: 15/119,656

(22) PCT Filed: Feb. 17, 2015

(86) PCT No.: PCT/KR2015/001600
§ 371 (c)(1),
(2) Date: Aug. 17, 2016

(87) PCT Pub. No.: WO2015/122745
PCT Pub. Date: Aug. 20, 2015

(65) Prior Publication Data
US 2017/0013749 A1     Jan. 12, 2017

(30) Foreign Application Priority Data

Feb. 17, 2014   (KR) .................. 10-2014-0017828

(51) Int. Cl.
*H05K 9/00*     (2006.01)
*H01L 23/552*     (2006.01)
*H01L 21/48*     (2006.01)

(52) U.S. Cl.
CPC ....... *H05K 9/0081* (2013.01); *H01L 21/4817* (2013.01); *H01L 21/4878* (2013.01); *H01L 23/552* (2013.01); *H05K 9/0032* (2013.01)

(58) Field of Classification Search
CPC .. H05K 9/0081; H05K 9/0032; H05K 9/0024; H05K 9/0083; H05K 9/0084; H01L 21/4817; H01L 21/4878; H01L 23/552
See application file for complete search history.

(56) References Cited

FOREIGN PATENT DOCUMENTS

| KR | 10-0456126 B1 | 11/2004 |
|----|---------------|---------|
| KR | 10-0673531 B1 | 1/2007 |
| KR | 10-0729708 B1 | 6/2007 |
| KR | 10-1217708 B1 | 1/2013 |

*Primary Examiner* — Peter DungBa Vo
*Assistant Examiner* — Tam Truong
(74) *Attorney, Agent, or Firm* — Novick, Kim & Lee, PLLC; Sang Ho Lee

(57) ABSTRACT

The present inventive concept relates to a method for manufacturing a shield can which absorbs and blocks electromagnetic waves generated in a circuit device inside an electronic device such as a portable phone, a PCS, or an RF communication apparatus and, more particularly, to a method for manufacturing a shield can for blocking electromagnetic waves, capable of continuously performing a manufacturing process from a metal band which is wound around a supply roll to the shield can to which a shielding tape is attached.

4 Claims, 11 Drawing Sheets

(Exploded View)

(Assembled View)

METHOD FOR MANUFACTURING SHIELD CANS FOR BLOCKING ELECTROMAGNETIC WAVES

TECHNICAL FIELD

The present inventive concept relates to a method of manufacturing a shield can which absorbs and blocks electromagnetic waves generated in a circuit device inside an electronic device such as a portable phone, a PCS, or an RF communication apparatus and, more particularly, to a method of manufacturing a shield can for blocking electromagnetic waves, by which a manufacturing process of from forming a lid and a frame from metal bands wound around a supply roll to attaching a shielding tape to a shield can is continuously performed.

BACKGROUND ART

With a rapid development of electronic and communications technologies, a use of unit circuits having various functions and densely arranged in a narrow space has been technically possible. However, generation of electromagnetic interference (EMI) has been a problem; for example, a device malfunctions due to interference of electromagnetic waves generated between adjacent circuits by each circuit.

Electromagnetic wave shielding methods according to related arts may generally include sealing a circuit generating electromagnetic waves by using a shield can, coating conductive silicon along a joint and a connection portion of a circuit sectioning member formed in an electronic device to prevent leakage of electromagnetic waves through the joint and the connection portion, and sealing each circuit section by using a conductive shielding tape manufactured to have the same shape as a section line in a circuit.

Using a shield can is the most popular one among the above-described methods. According to the method using a shield can, electromagnetic waves generated in a circuit device may be blocked by covering an upper portion of the circuit device with a shield can that is manufactured in a can shape using a metal plate or plastic to which a conductive metal such as Fe, Cu, Ni, etc. is added.

For example, as illustrated in FIG. 1, a shield can S may include a lid L and a frame F assembled to the inside of the lid L. According to a related art, the lid L and the frame F are separately formed by press and then manually assembled or input to a separate assembly device to be assembled in one body. Accordingly, productivity is low compared to high manufacturing costs.

To address the matter, as illustrated in FIGS. 2 to 4, Korean Patent No. 10-0456126 discloses an apparatus that includes a material supply portion 100, a sensing guide portion 200, an assembly portion 300, a transfer portion 400, a scrap cutting portion 1 500, a finished product cutting portion 600, and a scrap cutting portion 2 700, thereby enabling automation of a manufacturing process of the shield can S.

In the method of manufacturing the shield can S, the lid L having a certain shape and a downwardly bent edge, and the frame adequately inserted into the inside of the lid L and having a contact portion F1 provided along the edge. A first-tier flat band 10, on which the lids L are continuously and repeatedly press-formed in a lengthwise direction thereof, is supplied in an upper side, and simultaneously, a second-tier flat band 20, on which the frames F are continuously and repeatedly press-formed in the lengthwise direction thereof, is supplied in a lower side. In this state, the frame F is punched to be inserted into the lid L formed on the first-tier flat band 10 while cutting support ends 21 of the frame F formed on the second-tier flat band 20. Then, support ends 11 of the lid L formed on the first-tier flat band 10 are cut so that the shield can S may be finished.

The above apparatus and method of manufacturing a shield for IC device has a merit of enabling automation of a shield can manufacturing process and thus reducing a defect rate.

Recently, stronger electromagnetic waves are generated as performance of electronic devices such as mobile phones is further improved. In order to improve shield performance with respect to the electromagnetic waves, a process of attaching a separate shielding tape to a surface of the shield can S is needed.

In this case, when the flat bands 10 and 20 wound in a roll shape are manufactured by a method such as extrusion, oil and so forth from a mold may coat surfaces of the flat bands 10 and 20 so that an adhesion force of a shielding tape is deteriorated.

Furthermore, in a state in which oil is coated on the surfaces of the flat bands 10 and 20, when the shield can S is manufactured and applied to mobile phones, performance of the shield can S is deteriorated due to radiated heat of electronic parts so that the interior of an electronic product is contaminated.

DETAILED DESCRIPTION OF THE INVENTIVE CONCEPT

Technical Problem

The present inventive concept provides a method of manufacturing a shield can for blocking electromagnetic waves, by which the electromagnetic waves may be efficiently blocked, compared to a related art.

The present inventive concept provides a method of manufacturing a shield can for blocking electromagnetic waves, by which lowering of an adhesion force of a shielding tape and contamination of an electronic device adopting a shield can may be prevented.

The present inventive concept provides a method of manufacturing a shield can for blocking electromagnetic waves, which facilitates collection of a used shielding tape that is punched.

Technical Solution

According to an aspect of the present inventive concept, there is provided a method of manufacturing a shield can for blocking electromagnetic waves, the shield can including a lid and a frame assembled to each other, the method including supplying a first metal band for manufacturing the lid by intermittently drawing the first metal band from a bobbin around which the first metal band is wound in a roll shape, and supplying a second metal band for manufacturing the frame by intermittently drawing the second metal band from a bobbin around which the second metal band is wound in a roll shape, pressing each of the first and second metal bands thus supplied so that the lid and the frame are continuously formed on the first and second metal bands and remain on the first and second metal bands by connection bands, cleaning and drying the first and second metal bands thus pressed, intermittently supplying the first metal band thus cleaned in an upper side, and intermittently supplying the second metal band in a lower side of the first metal band, in parallel to each other, attaching a first shielding tape to a lower surface of the lid on the first metal band, assembling the lid and the frame by cutting the connection bands of the lid to which the first shielding tape is attached and the frame to which the shielding tape is not attached, and attaching a second shielding tape to a lower surface of the frame assembled to the lid.

In the cleaning and drying of the first and second metal bands thus pressed, the first and second metal bands may be ultrasound-cleaned by passing through a cleaning reservoir where a cleaning water is filled and ultrasound waves are generated by an ultrasound generator, and the cleaning water remaining on the first and second metal bands may be removed by blowing air In the attaching of the first shielding tape, the first shielding tape may include a shielding tape having one surface coated with an adhesive and a transfer sheet detachably attached to the adhesive of the shielding tape, the first shielding tape may be supplied with the shielding tape and the transfer sheet being separated from the first shielding tape, the shielding tape thus separated may be punched and the shielding tape thus punched may be attached to the lower surface of the lid, and the shielding tape that remains after being punched and the transfer sheet may be reattached to each other and discharged.

Advantageous Effects

First, first and second metal bands 110 and 210 are ultrasound-cleaned so that a contaminant such as oil and moisture on the surfaces thereof are removed. Accordingly, the lowering of an adhesion force of a shielding tape may be prevented and an electronic device adopting a shield can S may be prevented from being contaminated.

Second, as the shielding tape is attached to a lid L and a frame F, electromagnetic waves may be efficiently blocked and an assembly process of the lid L and the frame F and an attachment process of the shielding tape may be automated.

Third, a shielding tape 311 that remains after being punched and a transfer sheet 312 are reattached to each other and discharged. Accordingly, a separate collecting roller is not necessary, and further, even when a first shielding tape 310 that is collected is accommodated in a collection container, the first shielding tape 310 may be easily collected from the collection container because adhesiveness of an adhesive 313 does not work.

BEST MODE

A method of manufacturing a shield can according to an embodiment may efficiently block electromagnetic waves compared to a related art, prevent lowering of an adhesion force of a shielding tape to a lid and a frame, and prevent contamination of an electronic device adopting the shield can.

Figure 1:
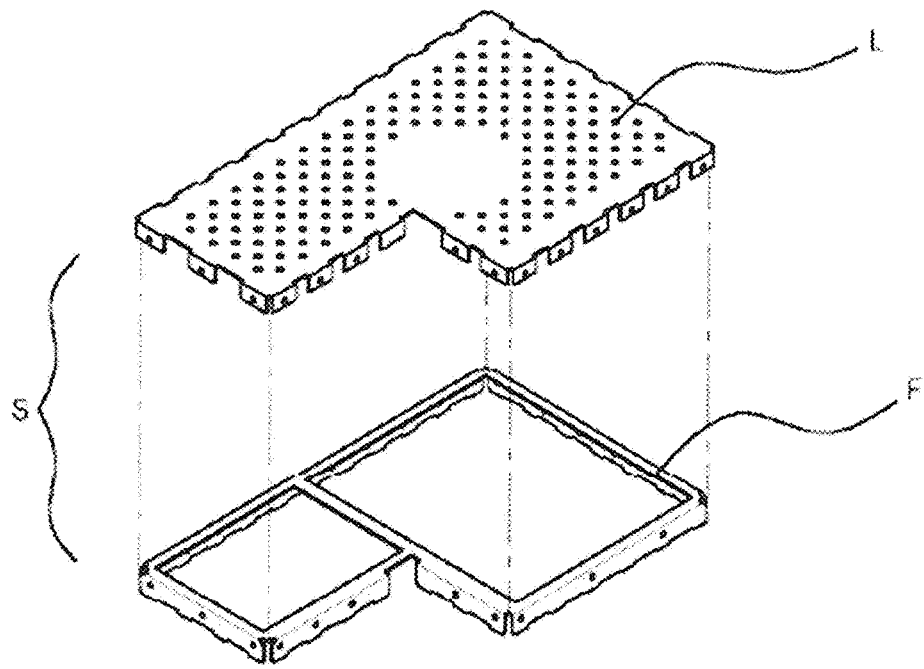
FIGS. 1 and 2 schematically illustrate a structure of a typical shield can.
Figure 1:
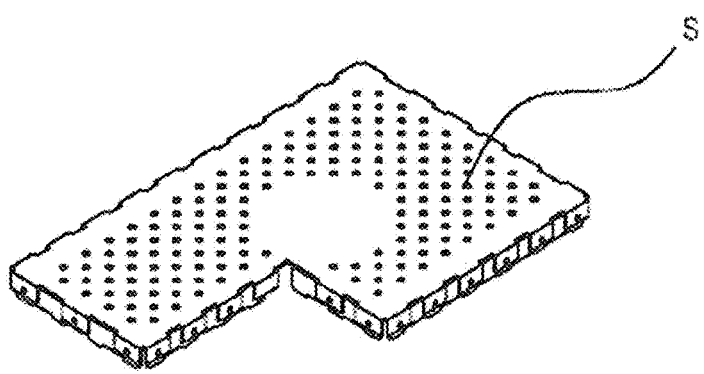
Figure 2:
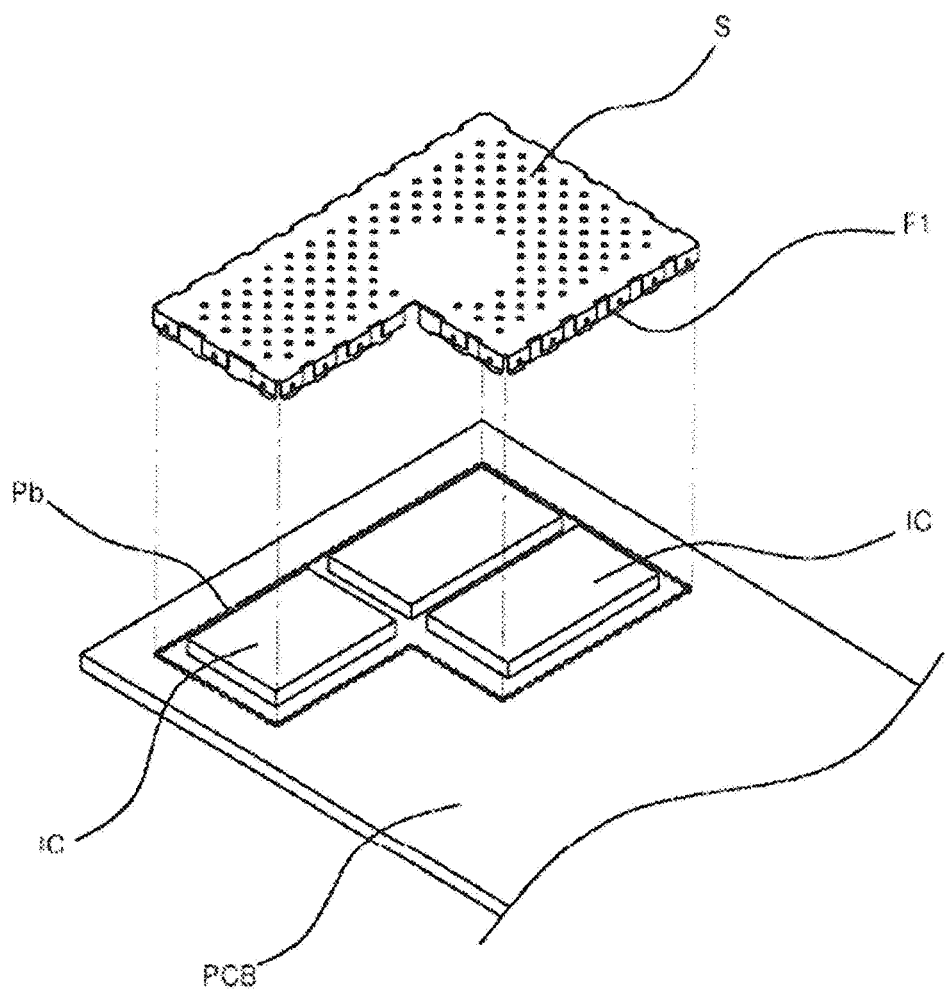
Figure 3:
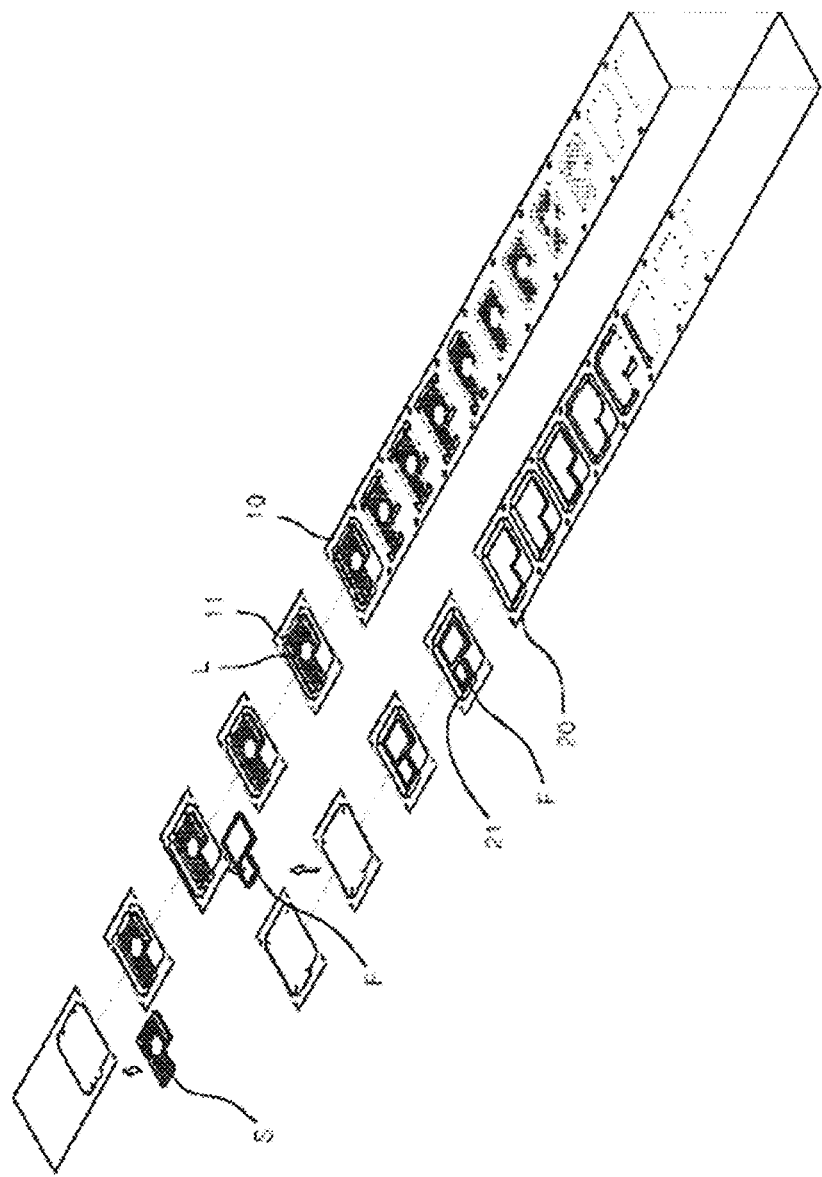
FIGS. 3 and 4 schematically illustrate a method of manufacturing a shield can according to a related art.
Figure 4:
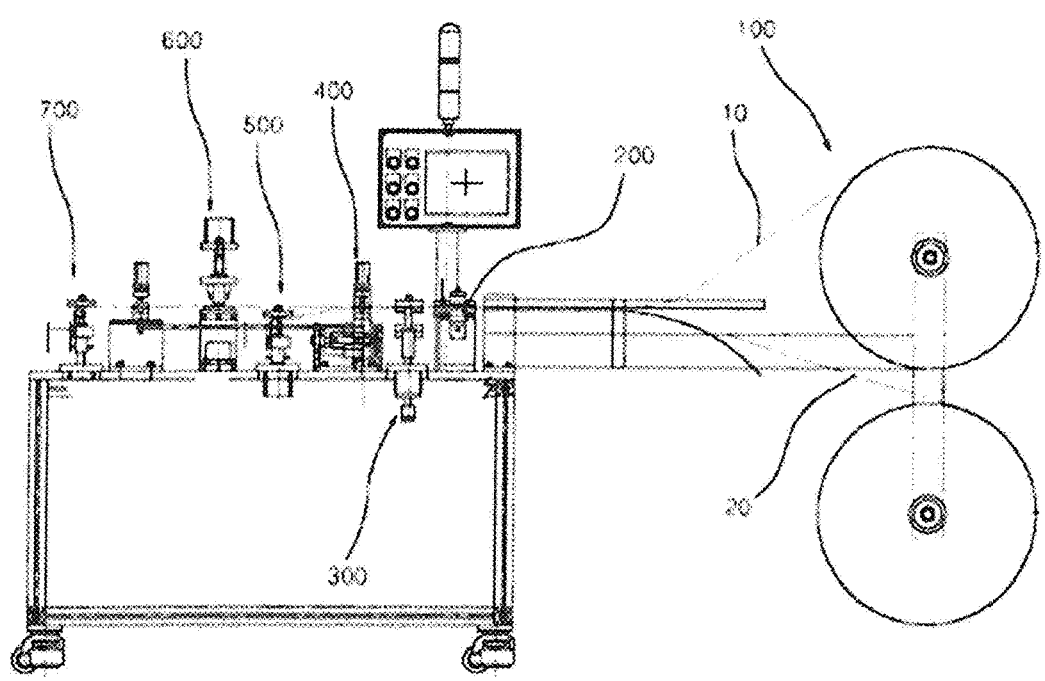
Figure 5:
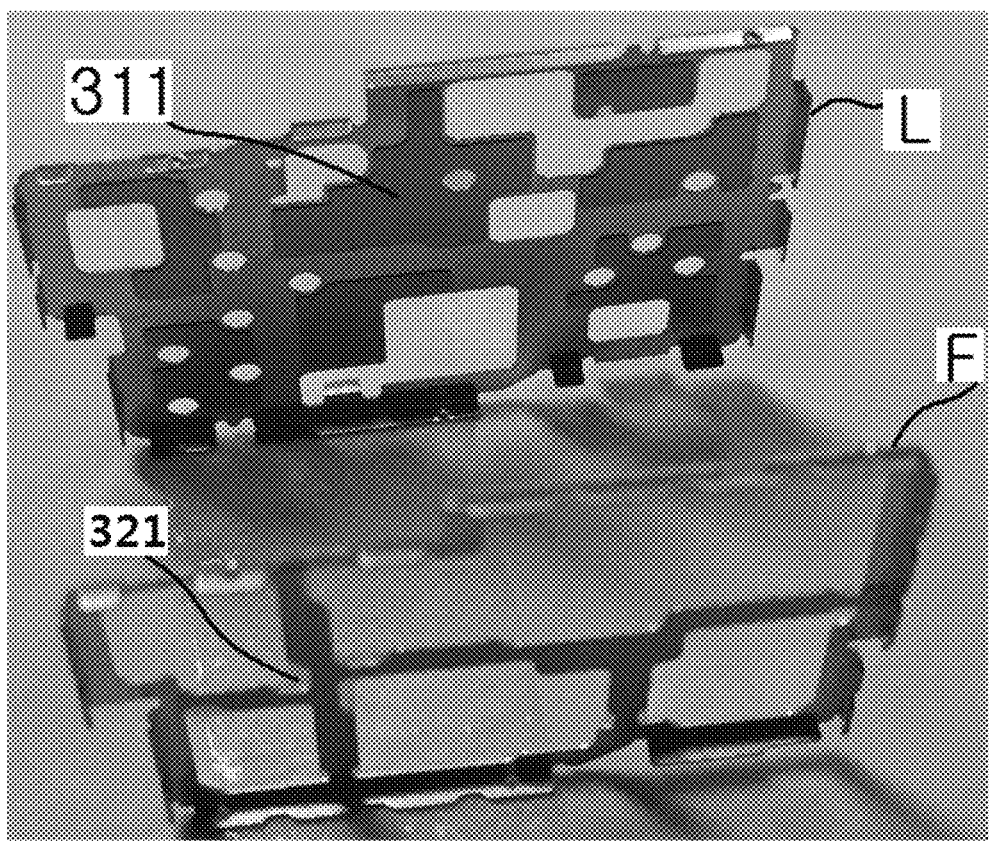
FIG. 5 is an image of a shield can in a disassembled state that is manufactured by a manufacturing method according to an embodiment.
Figure 6:
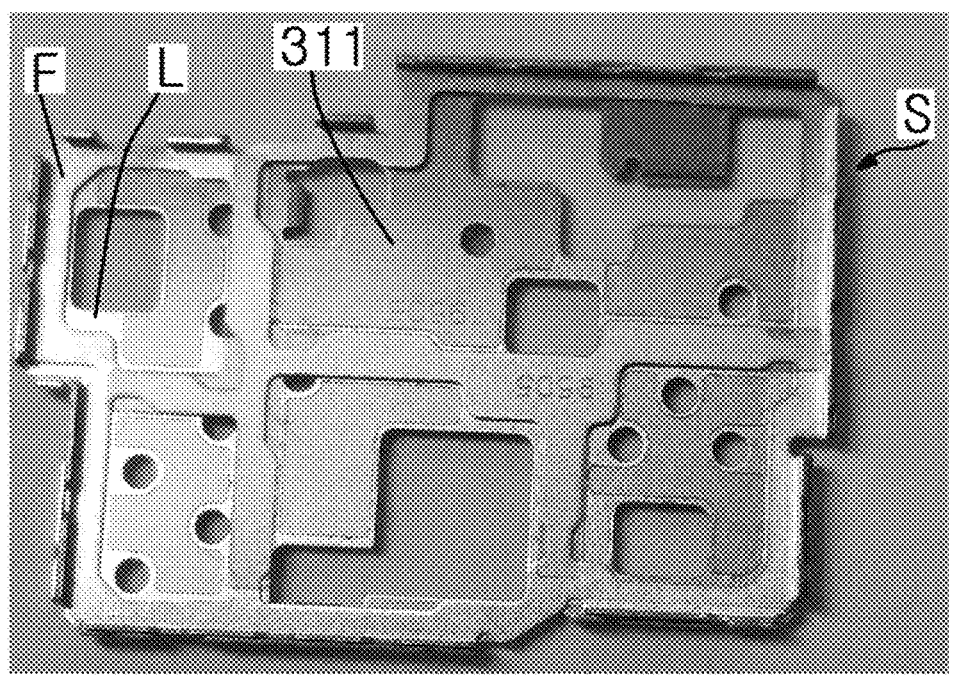
FIG. 6 is an image of the shield can of FIG. 5 in an assembled state.

First, referring to FIGS. 5 and 6, a shield can S according to the present embodiment has a structure in which a lid L and a frame F are assembled to each other and shielding tapes 311 and 321 are respectively attached to the lid L and the frame F.

Figure 7:
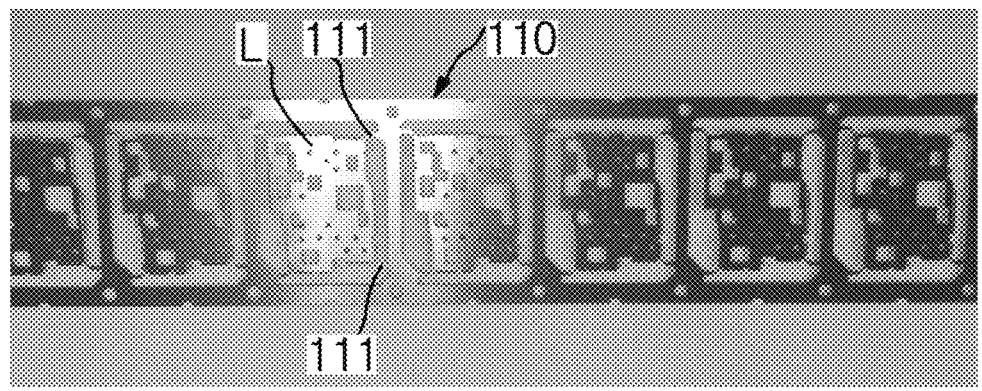
FIG. 7 is an image of a first metal band pressed in a lid shape.
Figure 8:
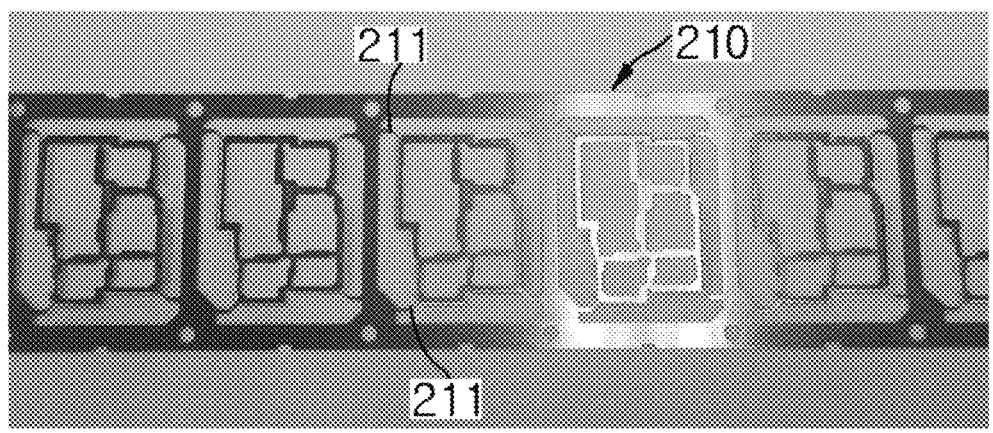
FIG. 8 is an image of a second metal band pressed in a frame shape.
Figure 13:
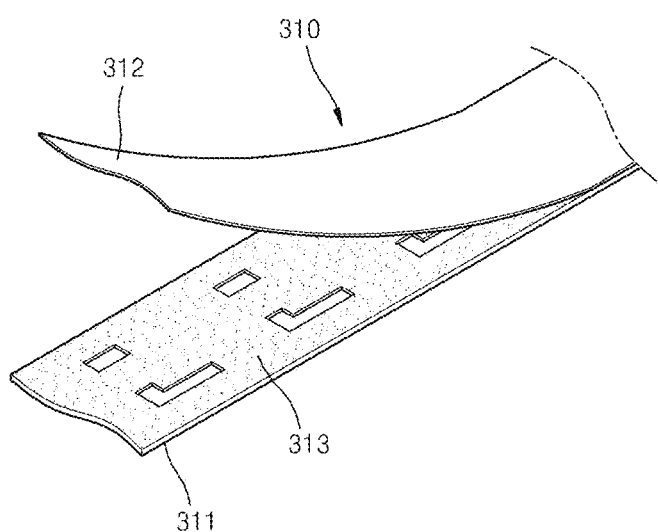
FIG. 13 is a perspective view of a first shielding tape.

Referring to FIGS. 7, 8, and 13, the shield can S is automatically assembled as a first metal band 110 continuously pressed in a shape of the lid L and a second metal band 210 continuously pressed in a shape of the frame F are respectively supplied in upper and lower sides and a first shielding tape 310 is supplied on a supply path of the first and second metal bands 110 and 210.

The shield can S as above may surround the exterior of an electronic part and absorb or block electromagnetic waves emitted from the electronic part.

A method of manufacturing a shield can according to an embodiment is described as follows.

Figure 9:
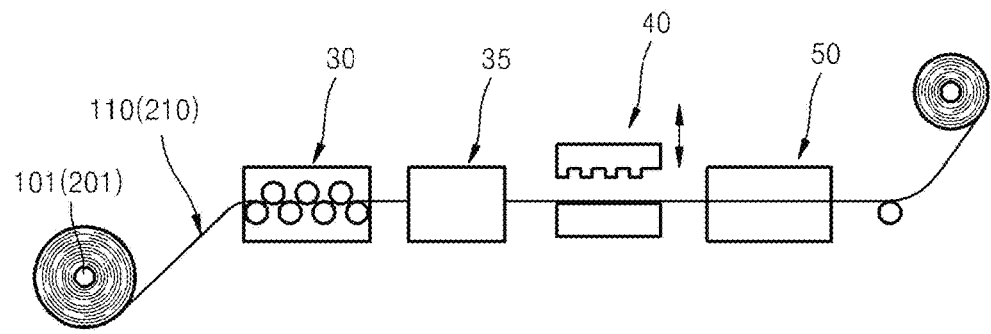
FIGS. 9 and 10 schematically illustrate process of a manufacturing method according to an embodiment.

Referring to FIG. 9, first, the first metal band 110 for manufacturing the lid L is supplied by being intermittently drawn from a bobbin 101 around which the first metal band 110 is rolled in a roll shape.

Also, the second metal band 210 for manufacturing the frame F is supplied by being intermittently drawn from a bobbin 201 around which the second metal band 210 is rolled in a roll shape.

An apparatus used for the process of FIG. 9 is manufactured in a pair so that the first metal band 110 and the second metal band 210 may be simultaneously supplied.

Next, the first metal band 110 and the second metal band 210 released from the bobbin 101 (201) are planarized through a leveling process 30.

For example, the first metal band 110 and the second metal band 210 that are thin metal films may be deformed; for example, the first and second metal bands 110 and 210 may be bent during transfer. Accordingly, the first metal band 110 and the second metal band 210 may be planarized through the leveling process 30.

In the leveling process 30, the first metal band 110 and the second metal band 210 are planarized by passing between a plurality of rollers arranged up and down and zigzag.

Each of the first metal band 110 and the second metal band 210 that are planarized may be step-transferred by a feeder 35 and supplied to a pressing process 40.

In the pressing process 40, as illustrated in FIGS. 7 and 8, the shapes of the lid L and the frame F are continuously formed on the first and second metal bands 110 and 210 and thus the lid L and the frame F respectively remain on the first and second metal bands 110 and 210 by connection bands 111 and 211.

The first and second metal bands 110 and 210 that are pressed are cleaned and dried through a cleaning process 50.

Figure 11:
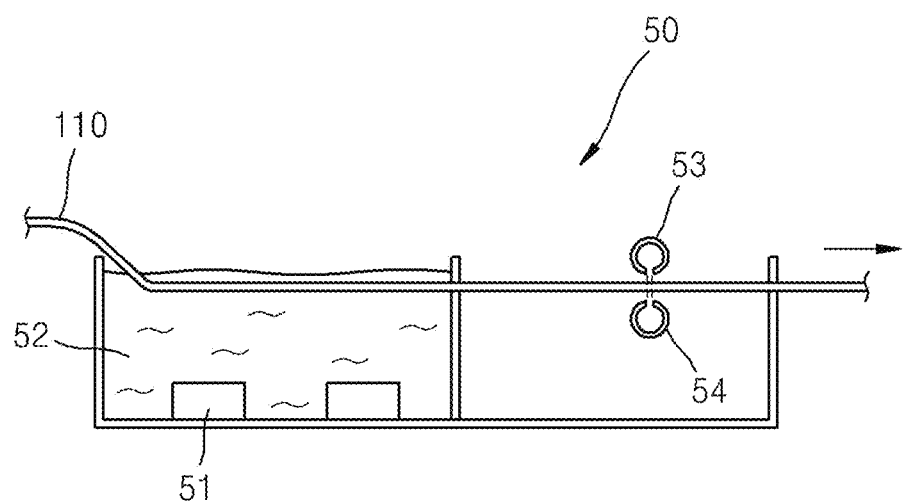
FIG. 11 illustrates a cleaning process.

Referring to FIGS. 9 and 11, in the cleaning process 50, the first and second metal bands 110 and 210 that are pressed are ultrasound-cleaned by passing through a cleaning reservoir where cleaning water 52 is filled and ultrasound waves are generated by an ultrasound generator 51. The cleaning water 52 remaining on the first and second metal bands 110 and 210 are removed by blowing high pressure air through pipes 53 and 54.

The first and second metal bands 110 and 210 that are cleaned are rolled in a roll shape as illustrated in the rightmost side of FIG. 9.

Figure 10:
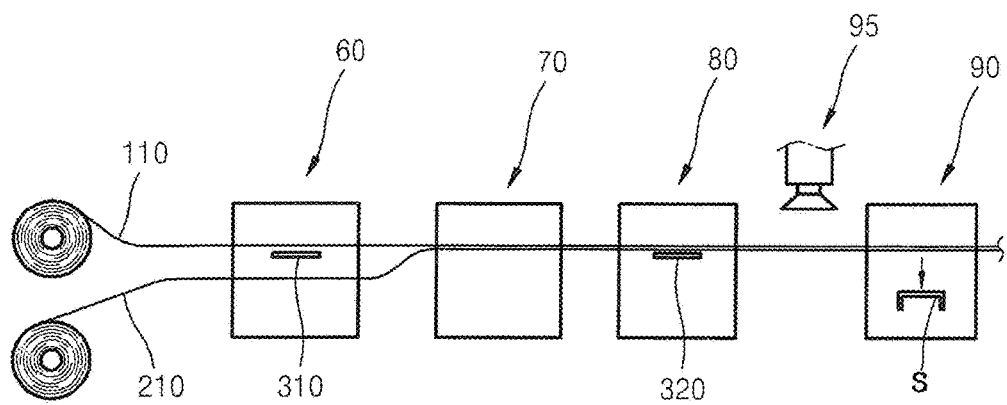

The first and second metal bands 110 and 210 that are rolled in a roll shape as above are arranged in upper and lower sides as illustrated in FIG. 10, and the first metal band 110 is intermittently supplied in the upper side and the second metal band 210 is intermittently supplied in the lower side of the first metal band 110, in parallel to each other.

While the intermittent supply of the first and second metal bands 110 and 210 is paused, the first shielding tape 310 is attached to a lower surface of the lid L on the first metal band 110

Referring to FIG. 13, the first shielding tape 310 may include the shielding tape 311 having one surface coated with an adhesive 313 and a transfer sheet 312 detachably attached to the adhesive 313 of the shielding tape 311.

Figure 12:
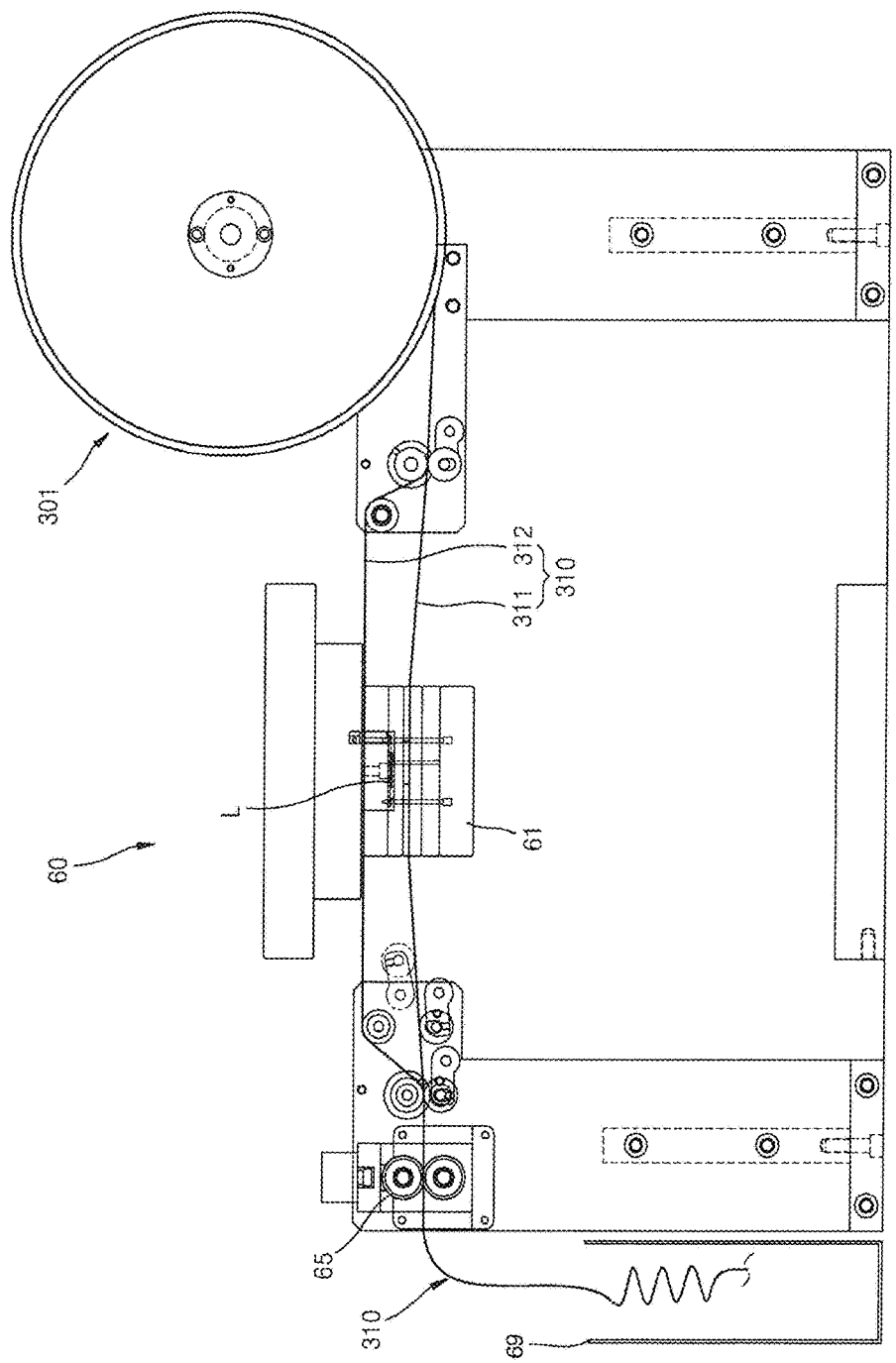
FIG. 12 illustrates a first shielding tape attachment process.

Referring to FIGS. 10 and 12, in an attachment process 60 of the first shielding tape 310, the first shielding tape 310 is supplied in a perpendicular direction to a direction in which the first metal band 110 is supplied, and the first and second metal bands 110 and 210 are transferred by being arranged in upper and lower sides of a guide block 61.

The first shielding tape 310 that is released from a tape roll 301 by a rotational driving force of a drawing roller 65 is supplied by being separated into the shielding tape 311 and the transfer sheet 312. The shielding tape 311 that is separated is punched and then the shielding tape 311 that is punched is attached to the lower surface of the lid L of the first metal band 110. The shielding tape 311 that remains after being punched and the transfer sheet 312 are reattached to each other and discharged.

As the shielding tape 311 that remains after being punched and the transfer sheet 312 are reattached to each other and discharged, a separate collecting roller for collecting the transfer sheet 312 and the shielding tape 311 that remains after being punched is not necessary.

Also, when the collecting roller for collecting the shielding tape 311 that remains after being punched is provided, separating the shielding tape 311 from the collecting roller is rather inconvenient due to the adhesiveness of the adhesive 313.

In the present embodiment, since the shielding tape 311 that remains after being punched and the transfer sheet 312 are reattached to each other and discharged, a separate collecting roller is not necessary and, even when the first shielding tape 310 that is collected is accommodated in an collection container 69, the adhesiveness of the adhesive 313 does not work so that the first shielding tape 310 may be easily collected from the collection container 69.

After the taping of the shielding tape 311 on the first metal band 110 is completed, the lid L and the frame F are assembled to each other while cutting the connection bands 111 and 211 of the lid L to which the first shielding tape 310 is attached and the frame F to which the shielding tape 310 is not attached (a cutting and assembly process 70 of FIG. 10)

The lid L and the frame F that are assembled to each other are transferred together on the same plane as the first and second metal bands 110 and 210.

After the lid L and the frame F are assembled to each other, a camera vision test may be performed to check an assembly error.

In a next process 80, a second shielding tape 320 is attached to a lower surface of the frame F that is assembled to the lid L.

Since the process 80 of attaching the second shielding tape 320 is substantially the same as the process of attaching the first shielding tape 310, a detailed description thereof is omitted.

Thereafter, an assembled state is finally checked through a vision test process 95. In a subsequent process 90, the shield can S that is manufactured is transferred to a package process, and the first and second metal bands 110 and 210 are destroyed at a certain interval and discharged.

The shield can S that is manufactured undergoes a shielding tape attachment state test and then is packaged.

As described above, according to the present inventive concept, as the first and second metal bands 110 and 210 are ultrasound-cleaned to remove contaminants such as oil on the surfaces thereof, lowering of adhesiveness of the shielding tape may be prevented and an electronic product adopting the shield can S may be prevented from being contaminated.

Furthermore, as the shielding tape is attached on the lid L and the frame F, electromagnetic waves may be efficiently blocked, and the assembly process of the lid L and the frame F and the attachment process of the shielding tape may be automated.

INDUSTRIAL APPLICABILITY

The method of manufacturing a shield can for blocking electromagnetic waves relates to a method of manufacturing a shield can which absorbs and blocks electromagnetic waves generated in a circuit device inside an electronic device such as a portable phone, a PCS, or an RF communication apparatus, by which a manufacturing process of from forming a lid and a frame from metal bands wound around a supply roll to attaching a shielding tape to a shield can may be continuously performed.

The invention claimed is:

1. A method of manufacturing a shield can for blocking electromagnetic waves, the shield can comprising a lid and a frame assembled to each other, the method comprising:
  supplying a first metal band for manufacturing the lid by intermittently drawing the first metal band from a bobbin around which the first metal band is wound in a roll shape, and supplying a second metal band for manufacturing the frame by intermittently drawing the second metal band from a bobbin around which the second metal band is wound in a roll shape;
  pressing each of the first and second metal bands thus supplied so that the lid and the frame are continuously formed on the first and second metal bands and remain on the first and second metal bands by connection bands;
  cleaning and drying the first and second metal bands thus pressed;
  intermittently supplying the first metal band thus cleaned in an upper side, and intermittently supplying the second metal band in a lower side of the first metal band, in parallel to each other;
  attaching a first shielding tape to a lower surface of the lid on the first metal band;
  assembling the lid and the frame by cutting the connection bands of the lid to which the first shielding tape is attached and the frame to which the shielding tape is not attached; and attaching a second shielding tape to a lower surface of the frame assembled to the lid.

2. The method of claim 1, wherein, in the cleaning and drying of the first and second metal bands thus pressed, the first and second metal bands are ultrasound-cleaned by passing through a cleaning reservoir where a cleaning water is filled and ultrasound waves are generated by an ultrasound generator, and the cleaning water remaining on the first and second metal bands are removed by blowing air.

3. The method of claim 1, wherein, in the attaching of the first shielding tape, the first shielding tape comprises a shielding tape having one surface coated with an adhesive and a transfer sheet detachably attached to the adhesive of the shielding tape, the first shielding tape is supplied with the shielding tape and the transfer sheet being separated from the shielding tape, the shielding tape thus separated is punched and the shielding tape thus punched is attached to the lower surface of the lid, and the shielding tape that remains after being punched and the transfer sheet are reattached to each other and discharged.

4. The method of claim 2, wherein, in the attaching of the first shielding tape, the first shielding tape comprises a shielding tape having one surface coated with an adhesive and a transfer sheet detachably attached to the adhesive of the shielding tape, the first shielding tape is supplied with the shielding tape and the transfer sheet being separated from the shielding tape, the shielding tape thus separated is punched and the shielding tape thus punched is attached to the lower surface of the lid, and the shielding tape that remains after being punched and the transfer sheet are reattached to each other and discharged.

* * * * *